US007667527B2

(12) United States Patent

Clark, Jr. et al.

(10) Patent No.: US 7,667,527 B2
(45) Date of Patent: Feb. 23, 2010

(54) CIRCUIT TO COMPENSATE THRESHOLD VOLTAGE VARIATION DUE TO PROCESS VARIATION

(75) Inventors: William F. Clark, Jr., Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 11/561,480

(22) Filed: Nov. 20, 2006

(65) Prior Publication Data

US 2008/0116962 A1 May 22, 2008

(51) Int. Cl.
*H03K 3/01* (2006.01)

(52) U.S. Cl. ...................................... 327/534; 327/530

(58) Field of Classification Search ................. 327/530, 327/534
See application file for complete search history.

(56) References Cited

U.S. PATENT DOCUMENTS

| | | | | |
|---|---|---|---|---|
| 4,723,108 | A | 2/1988 | Murphy et al. | |
| 5,397,934 | A * | 3/1995 | Merrill et al. | 327/537 |
| 5,682,118 | A * | 10/1997 | Kaenel et al. | 327/534 |
| 5,883,544 | A * | 3/1999 | So et al. | 327/537 |
| 6,147,508 | A * | 11/2000 | Beck et al. | 326/32 |
| 6,313,691 | B1 * | 11/2001 | Podlesny et al. | 327/534 |
| 6,556,068 | B2 * | 4/2003 | Forbes et al. | 327/537 |
| 7,221,211 | B2 * | 5/2007 | Sumita et al. | 327/534 |
| 2001/0045854 | A1 | 11/2001 | Saito | |
| 2005/0278676 | A1 | 12/2005 | Dhanwada et al. | |

FOREIGN PATENT DOCUMENTS

| | | |
|---|---|---|
| JP | 10-335591 | 12/1998 |

* cited by examiner

*Primary Examiner*—Kenneth B. Wells
(74) *Attorney, Agent, or Firm*—Greenblum & Bernstein P.L.C.; Anthony J. Canale

(57) ABSTRACT

Structure and process for compensating threshold voltage variation due to process variation. The structure includes a circuit segmented into sub-blocks having a predetermined size corresponding to a characteristic length associated with a process variation. A local circuit is located in each circuit sub-block, and a reference signal coupled to each local circuit. The local circuit generates a compensation signal in response to the reference signal to adjust an electrical parameter of the respective sub-block to a predetermined value.

7 Claims, 8 Drawing Sheets

CIRCUIT TO COMPENSATE THRESHOLD VOLTAGE VARIATION DUE TO PROCESS VARIATION

FIELD OF THE INVENTION

The present invention relates to a semiconductor integrated circuit and a process to compensate for device process variations of the semiconductor integrated circuit, i.e., variations of threshold voltages (Vt) of FETs.

BACKGROUND DESCRIPTION

Semiconductor integrated circuits are normally designed in view of process variations in forming the circuits. Specifically, process variations are presumed, and semiconductor integrated circuits are designed such that they will operate reliably for desired performance within the presumed range of process variation. However, since it is difficult to presume device performance variations, the period of time required to design semiconductor integrated circuits is increased, and it is necessary to give timing margins to allow semiconductor integrated circuits to operate in worst cases. The semiconductor integrated circuits thus designed tend to suffer performance reductions. There have recently been proposed variation compensation circuits capable of compensating for device performance variations of semiconductor integrated circuits to enable the semiconductor integrated circuits to exhibit a constant performance level.

Threshold voltage variation of FETs is a typical type of device performance variation that occurs due to, e.g., rapid thermal anneal (RTA) intra-die variations. As the device manufacturing variations are the result of physical configuration variations and chemical compositions of the semiconductor devices, these variations essentially cannot be avoided because manufacturing errors cannot fully be eliminated.

Current mirrors are often utilized in analog circuits to precisely reproduce reference voltages and currents in areas around and within a chip. While threshold voltage (Vt) must be matched across the chip, long-range Vt mismatches are known to exist due to long-range intra-die process variation from RTA. Known solutions try to keep the local environment of transistors as identical as possible and employ physically large transistors in an effort to minimize mismatch. As these long range mismatch solutions are generally required to act on a very large area, these solutions have been found to be prohibitively expensive.

SUMMARY OF THE INVENTION

According to an aspect of the invention, a structure includes a circuit segmented into sub-blocks having a predetermined physical size corresponding to a fraction of a characteristic length associated with a process variation. A local circuit is located in each circuit sub-block, and a reference signal coupled to each local circuit. The local circuit generates a compensation signal in response to the reference signal to adjust an electrical parameter of a respective sub-block to a predetermined value.

According to another aspect of the invention, a process for regulating threshold voltage in a circuit having across circuit process variation includes dividing the circuit into a plurality of sub-blocks, and regulating a local threshold voltage in each sub-block.

Further, in still another aspect of the invention, a circuit having a parameter with a length-wise variation includes a plurality of sub-blocks, at least one regulator coupled to each sub-block, a reference signal coupled to each at least one regulator, and the at least one regulator structured and arranged to forward a signal to each sub-block so the parameter with a length-wise variation corresponds to a value of the reference signal.

DETAILED DESCRIPTION OF THE EMBODIMENTS OF THE INVENTION

The present invention is directed to a circuit structured and arranged to sample the local process environment and adjust body bias to keep the threshold voltage matched to a "master transistor" within the die, which enables accurate operation of circuits requiring precise Vt matching, e.g., current mirrors. According to an embodiment of the invention, a well grid is broken up into blocks that are a fraction, e.g., one-half the size (such as linear size), of an expected RTA length scale, and at least one voltage regulator is coupled to each block. According to a further embodiment of the invention, the block dimensions can be, e.g., 2 mm×2 mm for spike RTA.

Figure 1:
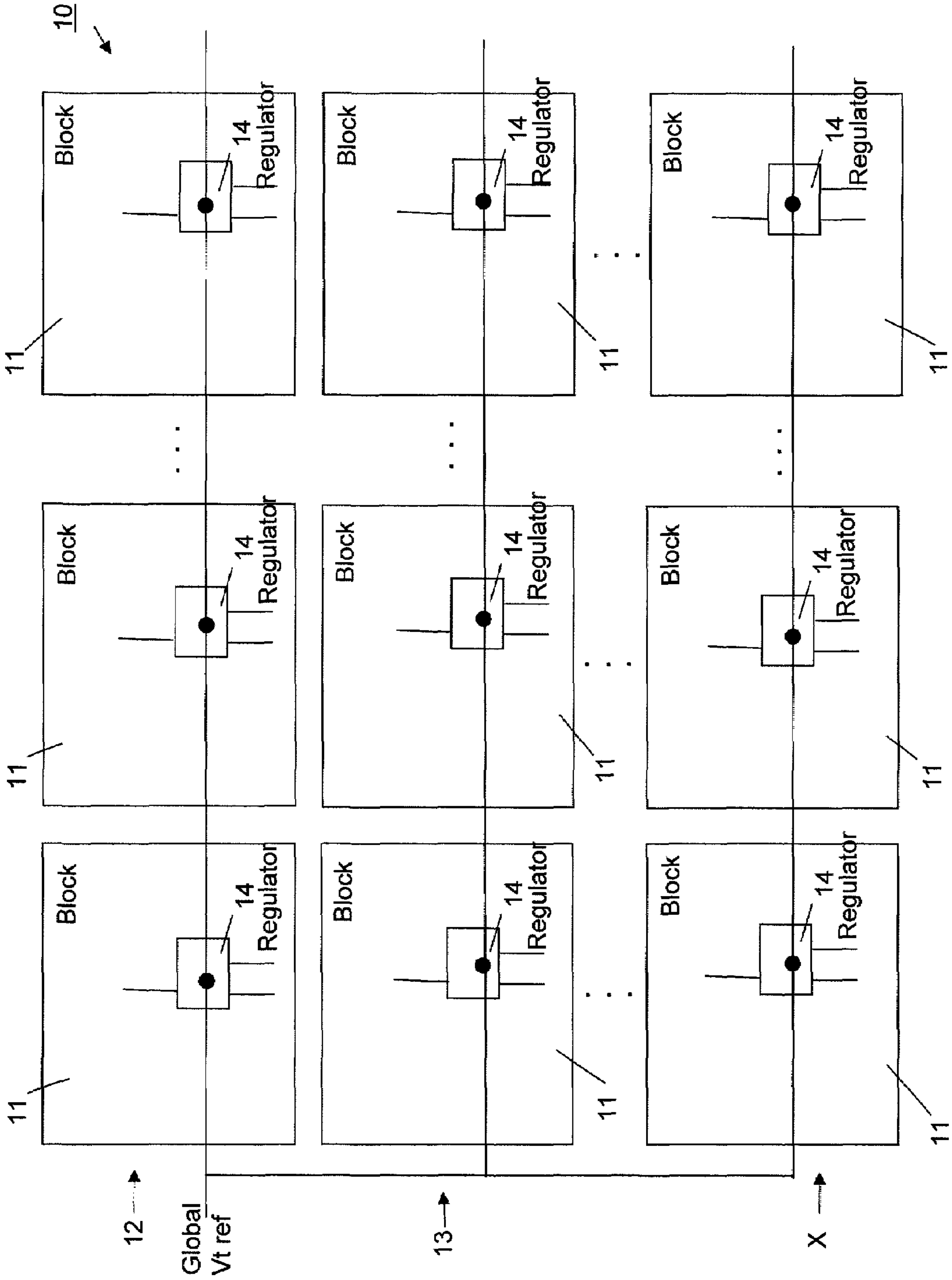
FIG. 1 illustrates the circuit according to the invention divided into physical sub-blocks.

As illustrated in FIG. 1, an integrated circuit chip 10 is shown in which system global variations in threshold voltage Vt of transistors are slowly varying over distance, e.g., due to long-range intra-die process variations in forming chip 10, e.g., from RTA. Thus, variations in threshold have a length scale, such that Vt mismatches or variations are known to occur across chip 10. Accordingly, chip 10 is divided into a number of blocks 11, the geometries of which correspond to, e.g., one-half the linear size (or physical range) of the RTA length scale, such as 2 mm×2 mm. Through each row 12, 13 of blocks 11, a global Vt ref signal is applied. However, due to the above-noted Vt mismatching, local Vt in each block can vary from the global Vt ref value. Accordingly, each block 11 includes at least one regulator 14, and preferably two regulators, coupled to a local well (or back grid) bias grid. In this regard, regulators 14 see the variations between local Vt and the global Vt ref value in order to compensate the circuit for the variation by generating a well bias (or body bias) to make the local Vt the same as the global Vt ref value.

Further, the geometry of blocks 11 can be determined based upon the designer's desired tolerance for threshold voltage and the given rate of variation R. In this regard, the size of the block×R is less than or equal to the desired tolerance. As noted above, the exemplary embodiment of the invention utilizes a block size of 2 mm×2 mm.

Figure 2A:
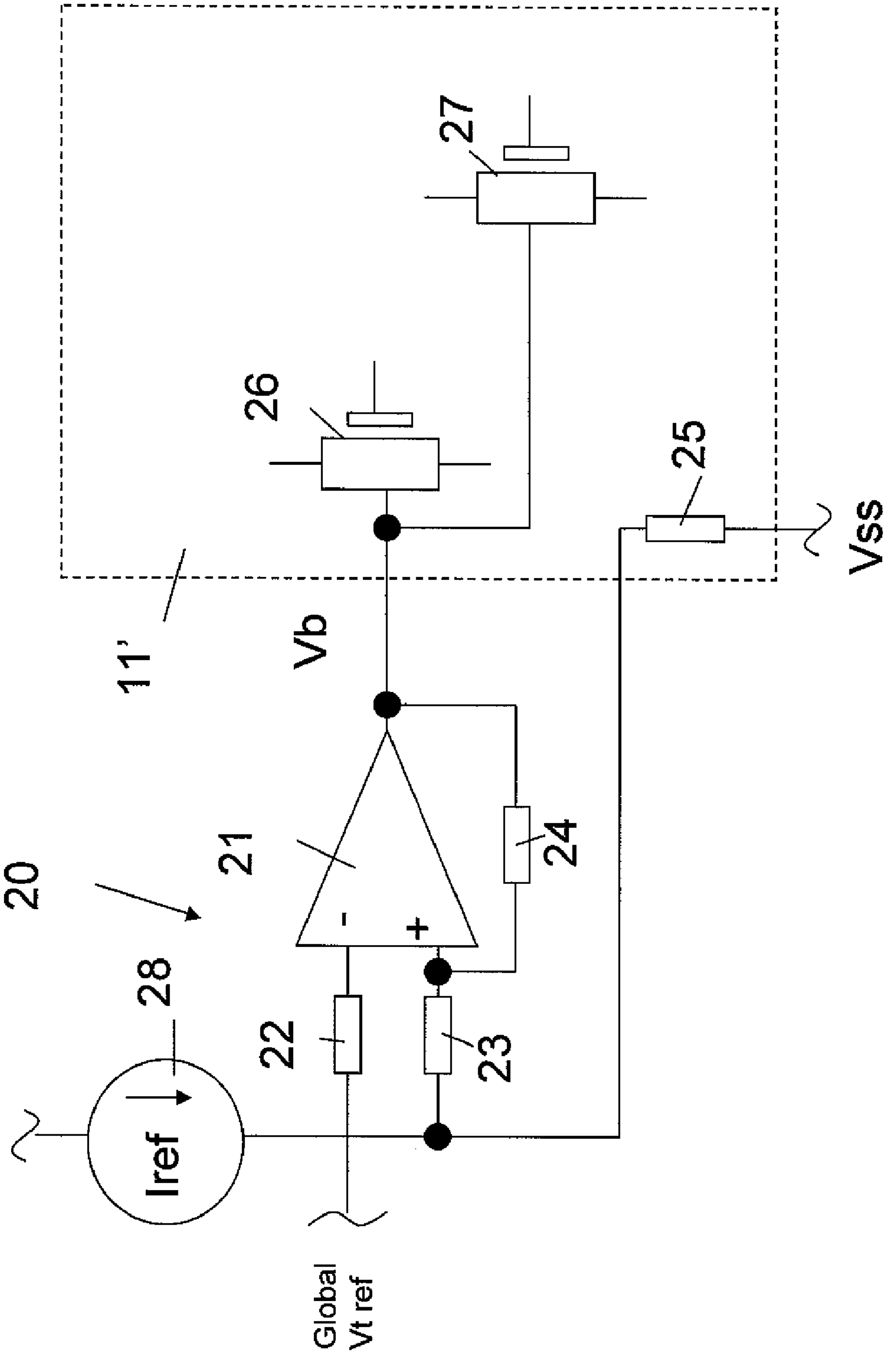
FIGS. 2*a* and 2*b* illustrate regulators for compensating local threshold voltage for nFETs and pFETs, respectively.

According to the exemplary embodiment of the present invention, each block 11 includes at least one regulator 14 to correct the local Vt of the block. As illustrated in FIG. 2*a*, a regulator 20 is coupled to a block 11" to correct the local Vt of block 11" to be the same as the global Vt ref value. Regulator 20 in FIG. 2*a* is arranged as a diffused resistor regulator for nFET body voltages. As shown, an amplifier 21 receives the global Vt ref through resistor 22 at the "-" input, and the local Vt through resistor 23 at the "+" input. Moreover, a current source 28, which can be any conventional current source, is coupled to the "+" input of amplifier 21, and the output of amplifier 21 is fed back to the "+" input through resistor 24. Local Vt is established from the drop across resistor 25 coupled to Vss, and the output of amplifier 21 is coupled to nFETs 26 and 27 of block 11' to adjust a well or body bias Vb to make Vt the same as the global Vt ref value. While the exemplary embodiment is utilized for nFETs, it is understood that a second regulator for pFETs can be employed in blocks 11 or the values for the pFETs can be extrapolated locally based upon the nFET bias. That is, by measuring the deviation of the nFET, one can make a reasonable prediction of necessary compensation for pFET variation.

Details of the circuit comprising resistors 22, 23, 24, and 25, in addition to current source 28 and amplifier 21, are engineered in a manner consistent and familiar to one skilled in analog circuit design to accomplish the correct level of Vt adjustment to transistors 26 and 27. In particular, the response in voltage change at resistor 25 from process variation is amplified by the ratio of resistor 24 to resistor 23 and translated to a Vt change in transistor 26 by the body effect coefficient dVt/dVb, i.e., the change in Vt divided by the change in body bias Vb. Thus, if a change in voltage across resistor 25 of, e.g., 10 mV corresponds to a required Vt adjustment of 30 mV at transistor 26, then the factor corresponding to the ratio of resistor 24 to resistor 23×dVt/dVb×10 mV must equal 30 mV.

Figure 2B:
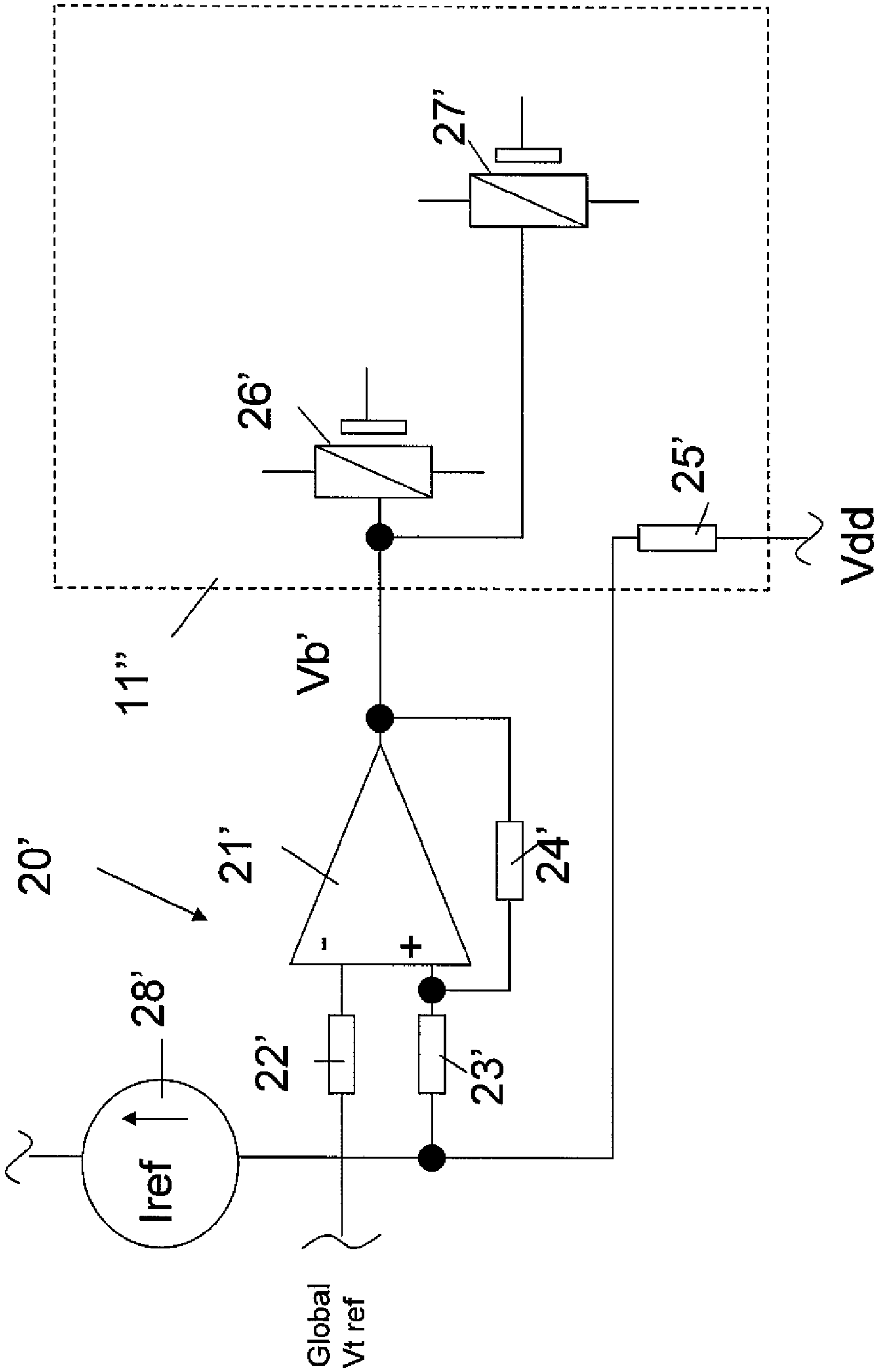

When the pFETs are to be adjusted with a second global Vt ref and complementary regulator, regulator 20' illustrated in FIG. 2*b* can be utilized. Regulator 20' is coupled to a block 11'' to correct the local Vt of block 11'' to be the same as the global Vt ref value. Regulator 20' in FIG. 2*b* is arranged as a diffused resistor regulator for pFET body voltages. As shown, an amplifier 21' receives the global Vt ref through resistor 22' at the "–" input, and the local Vt through resistor 23' at the "+" input. Moreover, a current source 28', which can be any conventional current source, is coupled to the "+" input of amplifier 21', and the output of amplifier 21' is fed back to the "+" input through resistor 24'. Local Vt is established from the drop across resistor 25' coupled to Vdd, and the output of amplifier 21' is coupled to pFETs 26' and 27' of block 11'' to adjust a well or body bias Vb' to make Vt the same as the global Vt ref value.

Figure 3A:
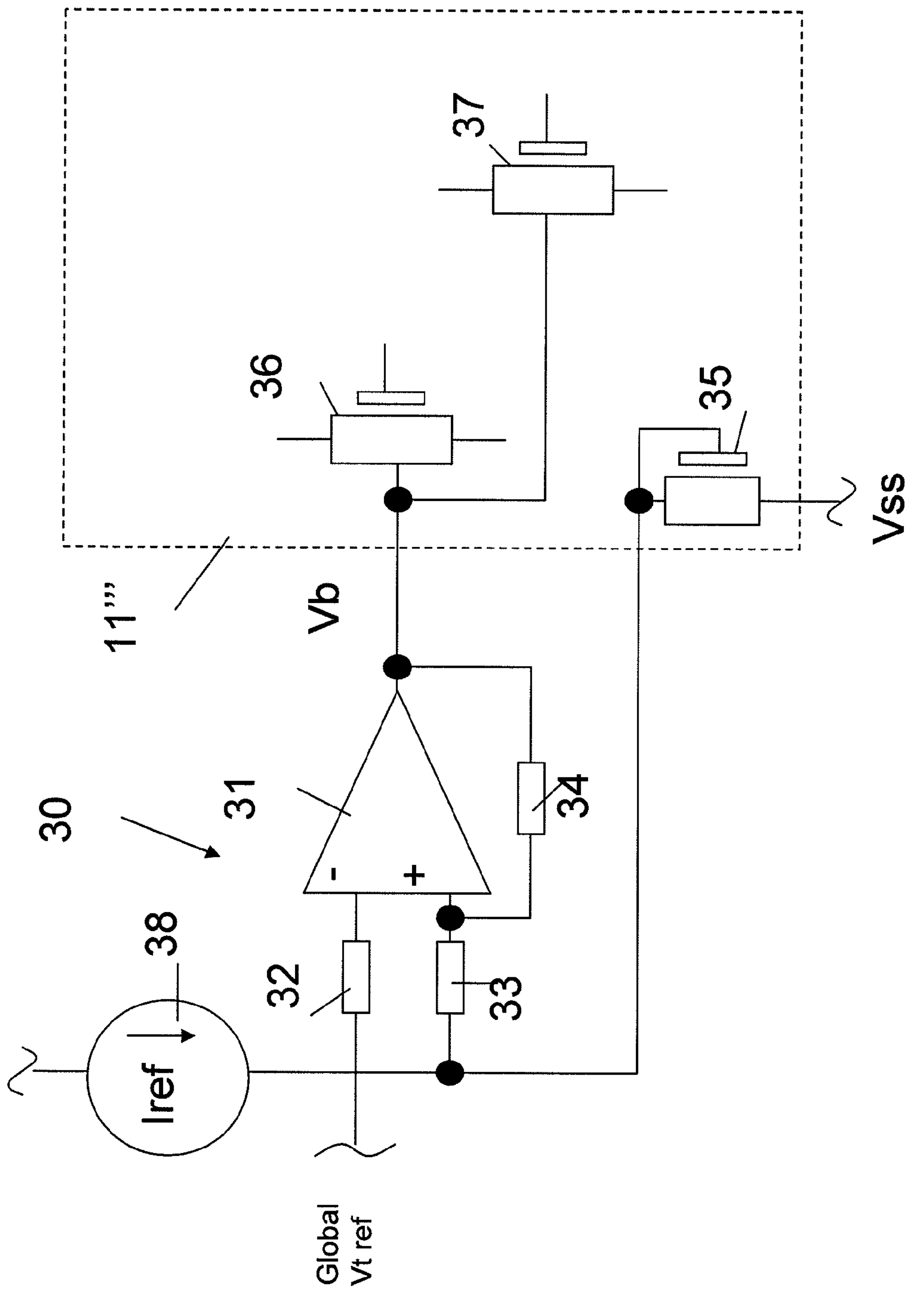
FIGS. 3*a* and 3*b* illustrate alternative regulators for compensating local threshold voltage for nFETs and pFETs, respectively.

In an alternative embodiment illustrated in FIG. 3*a* , regulator 30 is coupled to a block 11''' to correct the local Vt of block 11''' to be the same as the global Vt ref value. Regulator 30 in FIG. 3*a* is arranged as a drive current regulator for nFET body voltages. As shown, an amplifier 31 receives the global Vt ref through resistor 32 at the "–" input, and the local Vt through resistor 33 at the "+" input. Moreover, a current source 38, which can be any conventional current source, is coupled to the "+" input of amplifier 31, and the output of amplifier 31 is fed back to the "+" input through resistor 34. Local Vt is established from reference transistor 35 coupled to Vss, and the output of amplifier 31 is coupled to nFETs 36 and 37 of block 11''' to adjust a well or body bias Vb to make Vt the same as the global Vt ref value.

Details of the circuit comprising resistors 32, 33, and 24, and transistor 35, in addition to current source 38 and amplifier 31, are engineered according to means familiar to one skilled in analog circuit design to accomplish the correct level of Vt adjustment to transistors 36 and 37. In particular, the response in voltage change at transistor 35 from process variation is amplified by the ratio of resistor 34 to resistor 33 and translated to a Vt change in transistor 36 by the body effect coefficient dVt/dVb, i.e., the change in Vt divided by the change in body bias Vb. Thus, if a change in voltage across transistor 35 of, e.g., 20 mV corresponds to a required Vt adjustment of 30 mV at transistor 36, then the factor corresponding to the ratio of resistance 34 to resistance 33×dVt/dVb×20 mV must equal 30 mV.

As with the exemplary embodiment, this alternative embodiment is utilized for nFETs. Again, it is understood that a second regulator for pFETs can be employed in block 11''' or the values for the pFETs can be extrapolated locally based upon the nFET bias as illustrated in FIG. 3*c*. That is, by measuring the deviation of the nFET, one can make a reasonable prediction of necessary compensation for pFET variation.

Figure 3B:
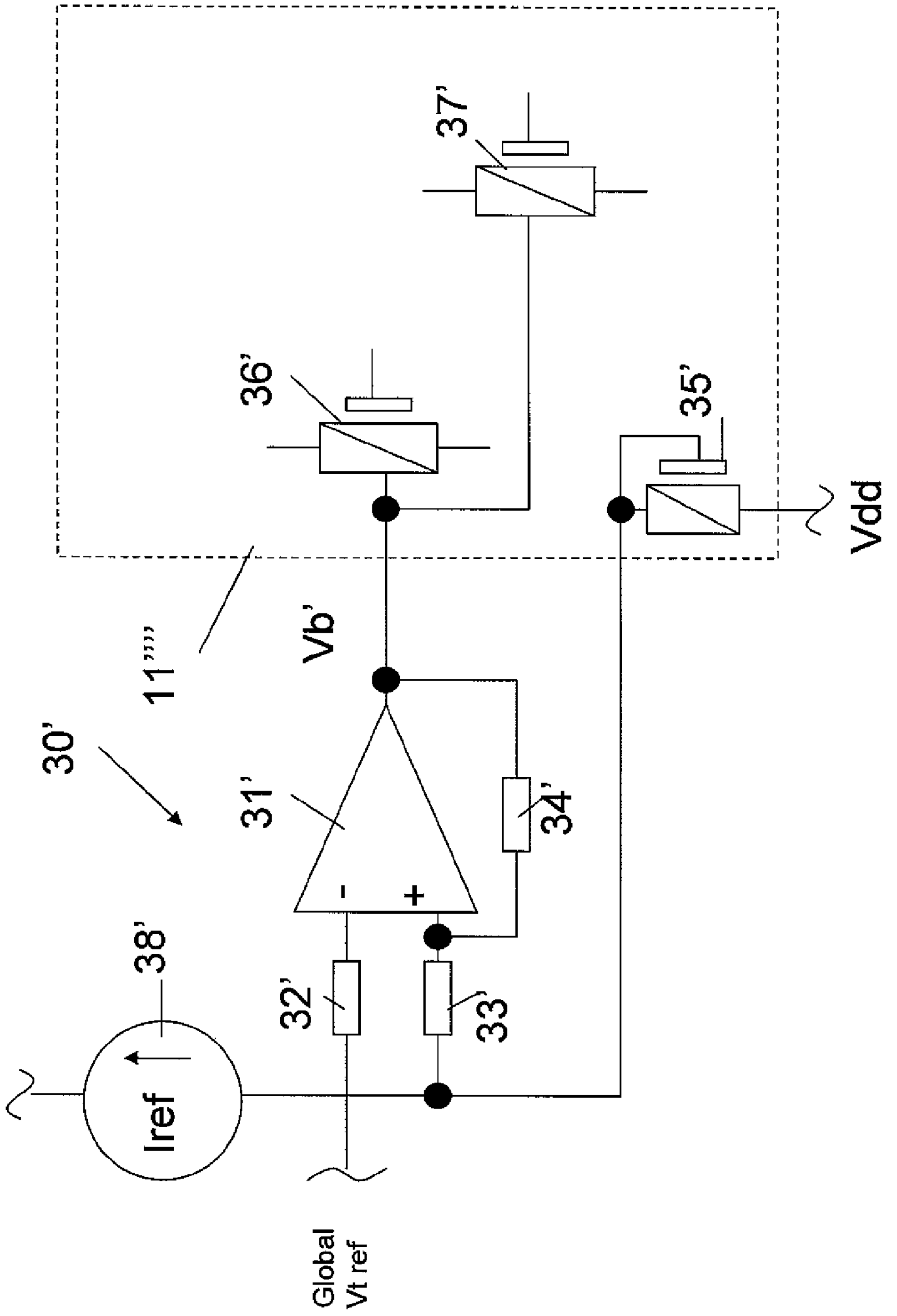
Figure 3C:
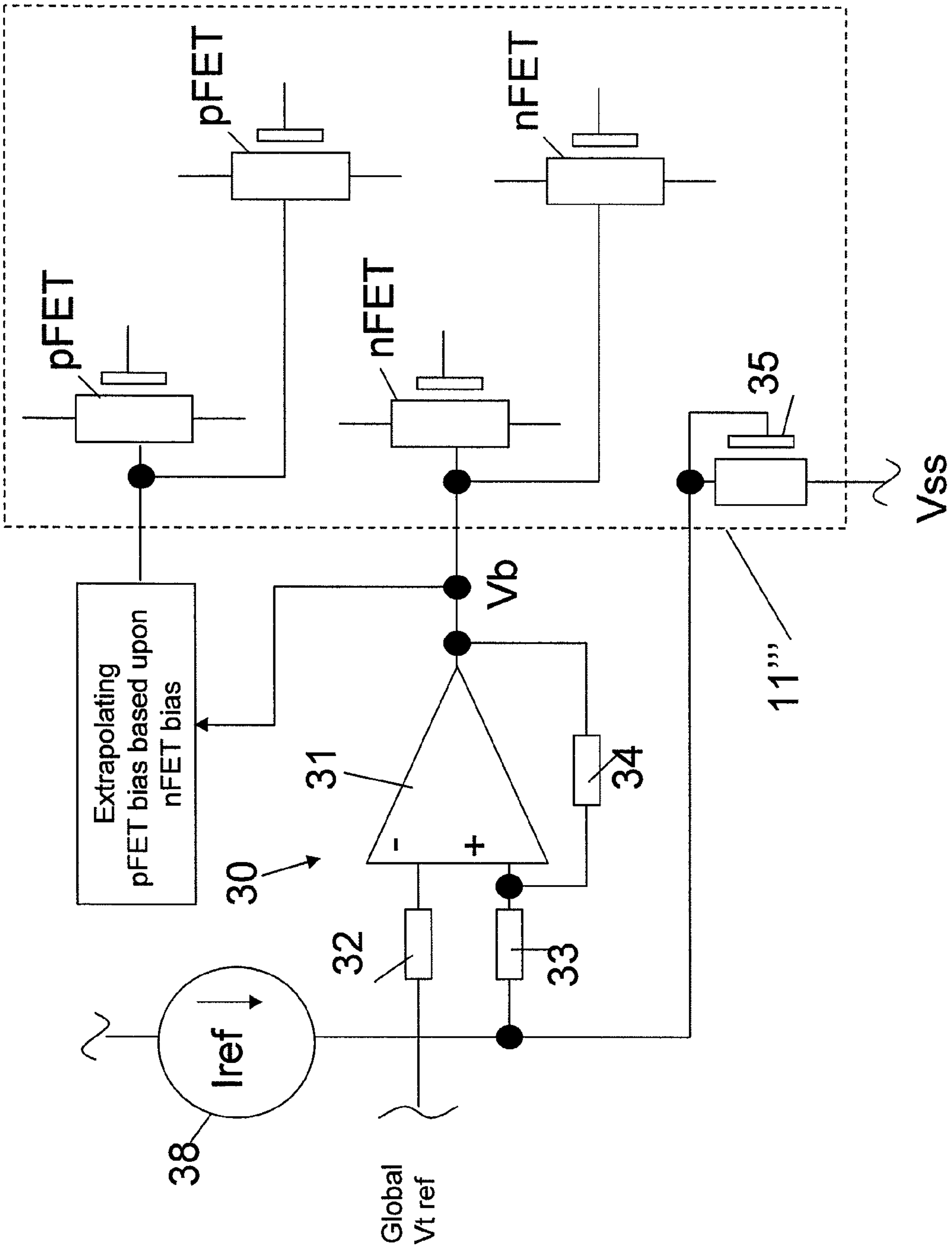
FIG. 3*c* illustrates the extrapolation of a pFET bias based upon an nFET bias.

When the pFETs are to be adjusted with a second global Vt ref and complementary regulator, regulator 30' illustrated in FIG. 3*b* can be utilized. Regulator 30' is coupled to a block 11''' to correct the local Vt of block 11''' to be the same as the global Vt ref value. Regulator 30' in FIG. 3*b* is arranged as a drive current regulator for pFET body voltages. As shown, an amplifier 31' receives the global Vt ref through resistor 32' at the "-" input, and the local Vt through resistor 33' at the "+" input. Moreover, a current source 38' , which can be any conventional current source, is coupled to the "+" input of amplifier 31', and the output of amplifier 31' is fed back to the "+" input through resistor 34' . Local Vt is established by reference transistor 35' coupled to Vdd, and the output of amplifier 31' is coupled to pFETs 36' and 37' of block 31' to adjust a well or body bias Vb' to make Vt the same as the global Vt ref value.

Figure 4A:
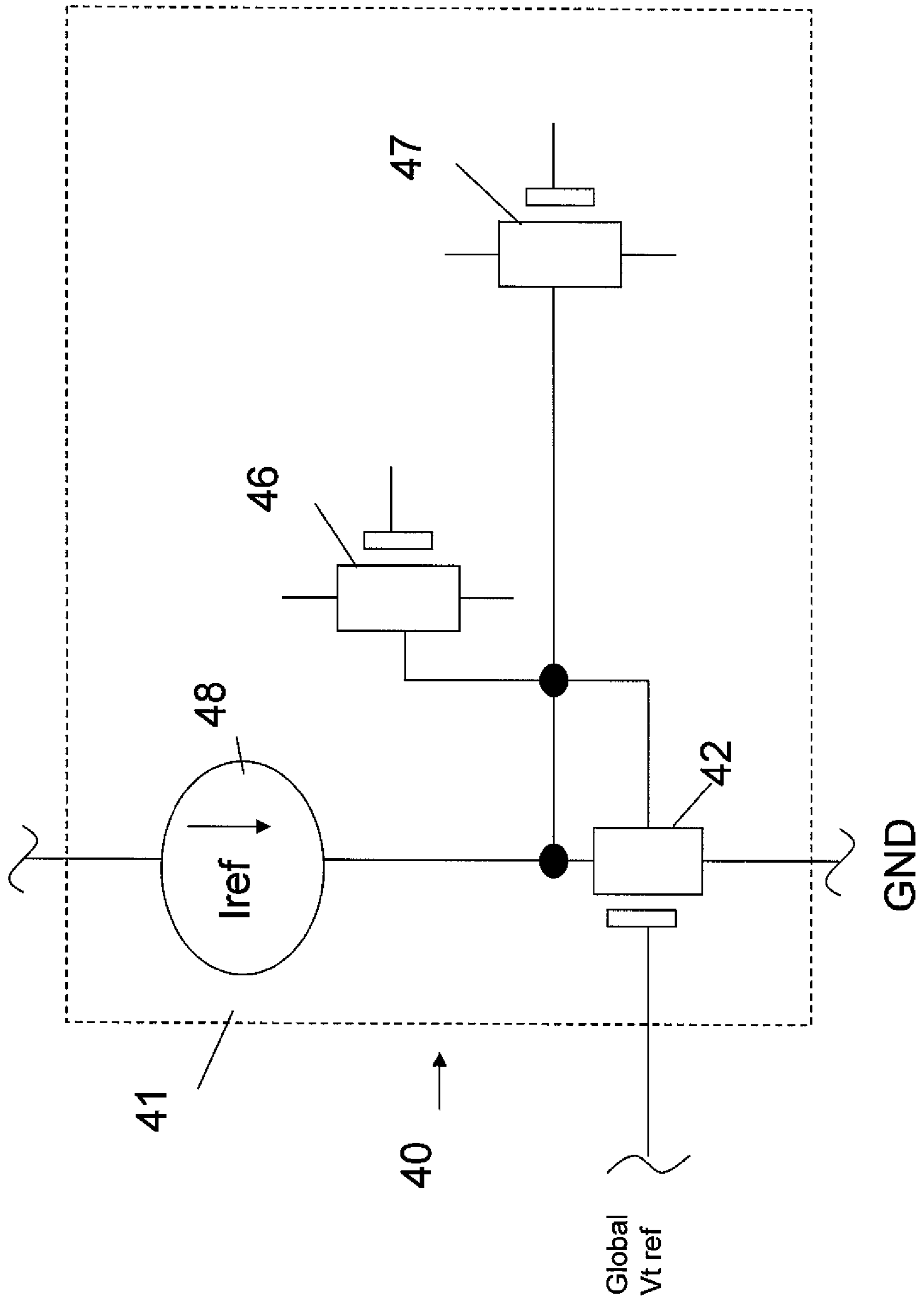
FIGS. 4*a* and 4*b* illustrate other alternative regulators for compensating local threshold voltage for nFETs and pFETs, respectively.

In a further variant of the exemplary embodiment, an FET can be arranged in the blocks to regulate local Vt. As illustrated in FIG. 4*a* , regulator 40 is composed of an nFET 42 coupled to global Vt ref, local Vt of block 41, and ground. Moreover, a current source 48, which can be any conventional current source, is coupled to the local Vt and, therefore, to nFETs 46 and 47 of block 41 to adjust a well or body bias to make Vt the same as the global Vt ref value.

Figure 4B:
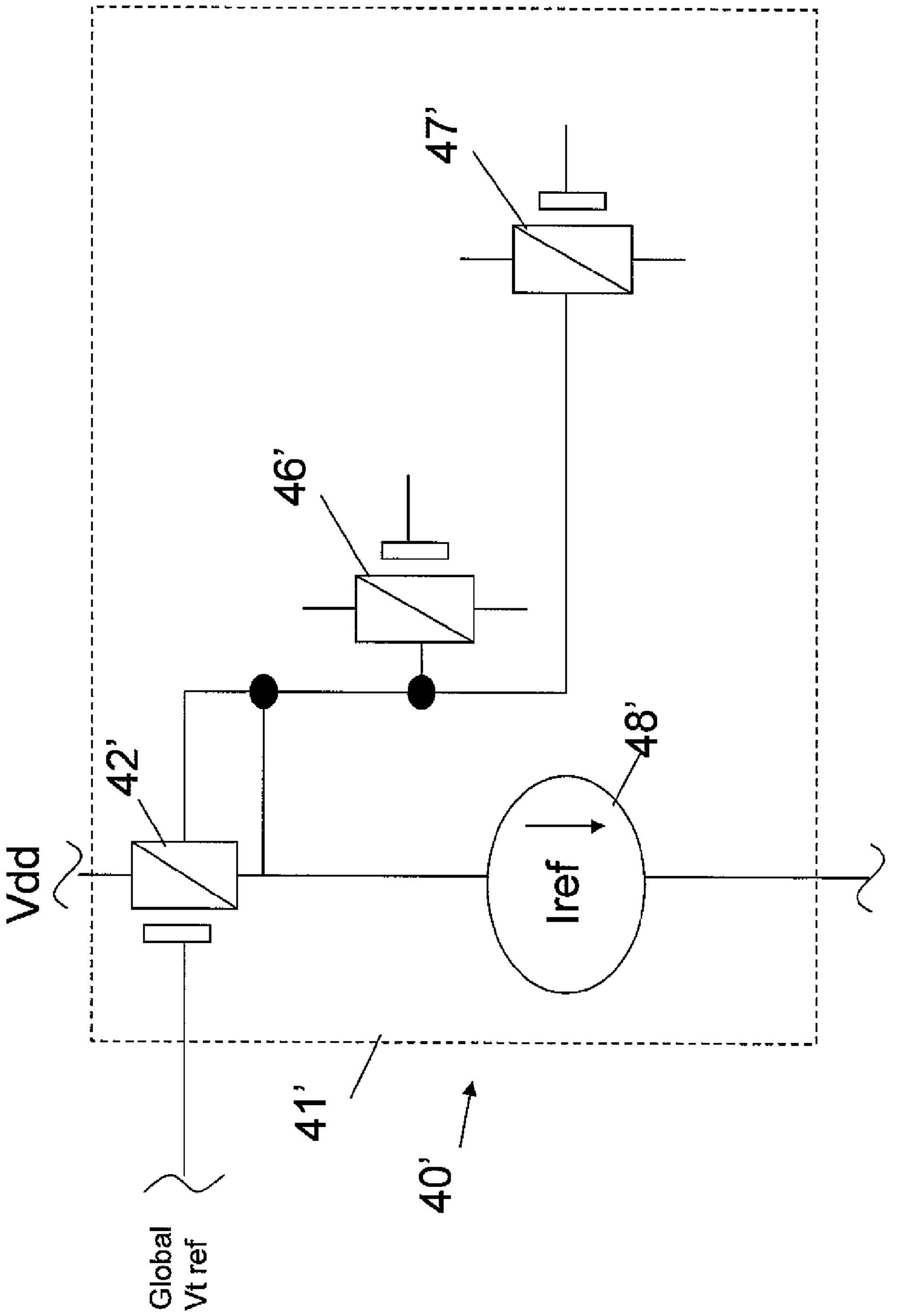

When the pFETs are to be adjusted with a second global Vt ref and complementary regulator, regulator 40' illustrated in FIG. 4*b* can be utilized. Regulator 40' is composed of a pFET 42' coupled to global Vt ref, local Vt of block 41', and ground. Moreover, a current source 48', which can be any conventional current source, is coupled to the local Vt and, therefore, to pFETs 46' and 47' of block 41' to adjust a well or body bias to make Vt the same as the global Vt ref value.

It is noted that the instant invention is applicable in both within die and intra die arrangements.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed. Moreover, the process as described above is used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of a preferred embodiment, those skilled in the art will recognize that the invention can be practiced with modifications within the spirit and scope of the appended claims.

What is claimed:

1. A process for regulating threshold voltage in a circuit having across circuit process variation, comprising:

dividing the circuit into a plurality of blocks dimensioned according to a characteristic associated with a process causing variation across the circuit; and regulating a local threshold voltage in each block, wherein, when the process causing variation is rapid thermal anneal, the blocks are dimensioned such that at least one of a length and a width of each block is about 2 mm.

2. The process in accordance with claim 1, wherein the local threshold voltage is regulated to correspond to a global threshold voltage reference value for the circuit.

3. The process in accordance with claim 1, wherein the blocks have a dimension of about 2 mm ×2 mm.

4. The process in accordance with claim 1, wherein the regulating comprises generating a well bias so that the local threshold voltage is the same as a global threshold voltage reference value.

5. The process in accordance with claim 1, further comprising coupling at least one regulator within each block.

6. The process in accordance with claim 5, wherein the at least one regulator comprises a regulator for nFETs and a regulator for pFETs.

7. The process in accordance with claim 5, wherein the at least one regulator comprises only a regulator for one of nFETs and pFETs, and the process further comprises extrapolating the local threshold voltage for the other one of nFETs and pFETs from a bias from the regulator.

* * * * *